United States Patent [19]

Kajihara et al.

[11] Patent Number: 5,122,862
[45] Date of Patent: Jun. 16, 1992

[54] CERAMIC LID FOR SEALING SEMICONDUCTOR ELEMENT AND METHOD OF MANUFACTURING THE SAME

[75] Inventors: Takehiro Kajihara, Komaki; Koichiro Maekawa, Ichinomiya; Toshio Ohashi, Komaki, all of Japan

[73] Assignee: NGK Insulators, Ltd., Japan

[21] Appl. No.: 493,399

[22] Filed: Mar. 14, 1990

[30] Foreign Application Priority Data

Mar. 15, 1989 [JP] Japan .................................. 1-60895

[51] Int. Cl.⁵ .......................................... H01L 23/02
[52] U.S. Cl. ........................................ 357/74; 357/70; 357/73
[58] Field of Search ............................. 357/74, 70, 73; 313/495

[56] References Cited

U.S. PATENT DOCUMENTS

| 4,704,626 | 11/1987 | Mahulikar et al. | 357/73 |
| 4,730,203 | 3/1988 | Watanabe et al. | 313/495 |
| 4,761,518 | 8/1988 | Butt et al. | 357/74 |

FOREIGN PATENT DOCUMENTS

| 39-240 | 1/1939 | Japan . |
| 47-51801 | 12/1972 | Japan . |
| 61-194751 | 8/1986 | Japan . |
| 63-242964 | 10/1988 | Japan . |

OTHER PUBLICATIONS

Patent Abstracts of Japan, vol. 7, No. 129 (E-179) Jun. 4, 1983 & JP-A-58 044749 (Nippon Denki KK) Mar. 15, 1983.
Patent Abstracts of Japan, vol. 11, No. 23 (E-473) Jan. 22, 1987 & JP-A-61 194751 (Hitachi Ltd) Aug. 29, 1986.

Primary Examiner—Eugene R. LaRoche
Assistant Examiner—R. A. Ratliff
Attorney, Agent, or Firm—Parkhurst, Wendel & Rossi

[57] ABSTRACT

A ceramic lid for sealing a semiconductor element and having a sealing surface which is to seal a semiconductor element within a recess of a ceramic package, by heating the recess with glass sealant and hermetically sealing the semiconductor element. The ceramic lid is made of alumina of high purity and to the sealing surface of the ceramic lid is applied a glass sealing aid which is pretreated at a higher temperature than the heating temperature for sealing the semiconductor element, before hermetically sealing the semiconductor element in the ceramic package. A method of manufacturing a ceramic lid for sealing a semiconductor element includes the steps of manufacturing the ceramic lid with alumina of high purity having a sealing surface with the recess of the ceramic package, wherein to the sealing surface of the ceramic lid is applied a glass sealing aid of 5-30 μm in thickness onto a sealing surface of the ceramic lid with the ceramic package. The ceramic lid is heat-treated at a higher temperature than the sealing temperature of the semiconductor element. Thereafter a glass sealant is applied and dried on the glass sealing aid layer, and then calcined at a temperature lower than the airtight sealing temperature of the semiconductor element, thereby removing an organic binder contained in the glass sealant. A semiconductor element is then housed within a recess of the ceramic package and the ceramic lid and a glass sealant are heated to hermetically seal the ceramic lid with the semiconductor element in the recess to the ceramic package.

9 Claims, 3 Drawing Sheets

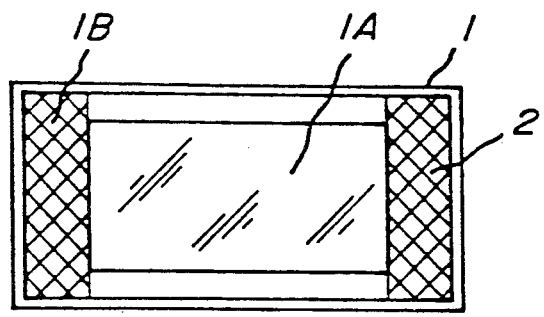
FIG_1
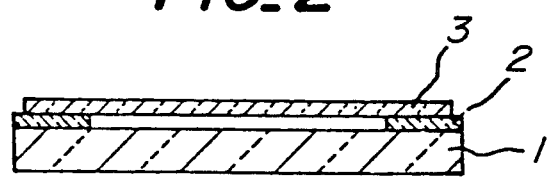
FIG_2
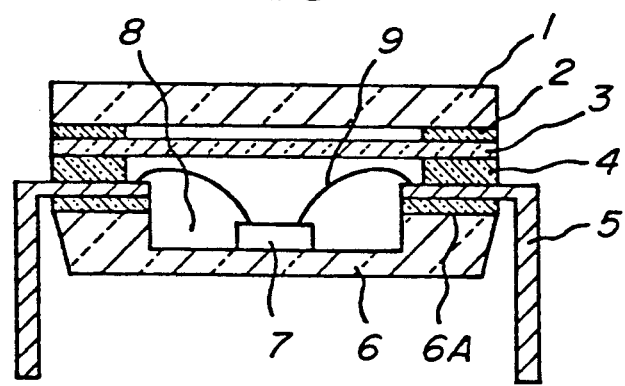
FIG_3

CERAMIC LID FOR SEALING SEMICONDUCTOR ELEMENT AND METHOD OF MANUFACTURING THE SAME

BACKGROUND OF THE INVENTION

1. Field of the Invention

The present invention relates to a ceramic lid for sealing a semiconductor element and a method of manufacturing the same. Specifically, the present invention relates to an alumina ceramic lid having excellent sealing strength with a ceramic package for housing a semiconductor element and a method of manufacturing the same. More specifically, the present invention relates to a ceramic lid for sealing an EPROM (Erasable and Programmable Read Only Memory) semiconductor element for erasing once-stored memory by ultraviolet radiation.

2. Related Art Statement

Hitherto, as a ceramic package for an EPROM semiconductor element, as described in Japanese Pat. Laid-open No. Sho 61-194,751(1986), there has been known such a structure that an EPROM semiconductor element is mounted on a recess of a ceramic package, and said package is hermetically sealed to an ultraviolet-transmissible ceramic or glass lid by means of a sealing glass. That is, as shown in FIG. 4, on a ceramic package 11 there is formed a recess 12 on the upper surface and a semiconductor element 13 and a lead frame 14 are secured in the recess by glass layers 15, 16, respectively. The semiconductor element 13 is bonded to the lead frame 14 by means of a wire 17. On an upper surface of the ceramic package 11 is sealed a plane ceramic or glass lid 18 via a glass layer 15 so as to seal the recess 12.

Moreover, as shown in FIG. 5, such a structure is also known that a bottom portion 16, a wire bonding portion 20 and a conductor portion 19 of a recess 12 of a ceramic package 11 are metallized, respectively. To both end portions of the conductor portion 19 lead frames 14 are brazed. Ceramic frames 21 for supporting a lid 18 are laminated on the upper surface of the conductor portion 19, and a ceramic or glass lid 18 is soldered 15 on glass-sealed or the upper surface of said ceramic frames 21.

As a ceramic package, use is made of alumina ceramics viewed from electrical properties such as thermal expansion, thermal conductivity, insulation resistance and the like, and mechanical strength.

Moreover, as a lid for sealing a semiconductor element, use is made of metal, plastic or ceramics, but when the package is alumina, it is preferable to use alumina ceramics so as to thermal expansion. Particularly, in the case of an EPROM semiconductor element, use is made of translucent polycrystalline alumina in relation to ultraviolet ray permeability as disclosed in U.S. Pat. No. 3026210, U.S. Pat. No. 3792142 and Japanese Pat. Laid-open No. Sho 63-242,964(1988).

However, in a ceramic package of the prior structure, a sealant of low melting glass at 400-500° C. is printed and dried on a translucent polycrystalline alumina lid or an alumina lid of high purity of more than 98 wt %, a semiconductor element is mounted within the package, and thereafter the sealant is heated to more than the melting point thereof. Although the ceramic lid is sealed to the ceramic package, the sealing strength is disadvantageously small.

Moreover, for higher data processing and miniaturization of ceramic packages, it is required to increase the memory amount of EPROM semiconductor elements, while the ceramic package for the memory semiconductor should be miniaturized. However, the high density technique of a semiconductor element is limited, and a size of the element becomes large with the increase of memory amount. Moreover, a size of a semiconductor ceramic package for memory is standardized for actually mounting on circuit boards, and it is difficult to change the size with an increase in element size.

An explanation is made in detail as follows. When the size of a ceramic package is 11 mm in width, 20 mm in length and 1.7 mm in thickness (except a lead portion), an ultraviolet irradiation portion of the semiconductor element requires about 9 mm × 9 mm at 1 Mega bit and about 9 mm × 14 mm at 2 Mega bit. In this case, the sealing portion of an ultraviolet permeable ceramic lid with a ceramic package becomes about 1 mm at 1 Mega bit and 2 Mega bit in the width direction, and 11 mm and 6 mm, respectively, at 1 Mega bit and 2 Mega bit in the lengthwise direction. That is, a sealing area is 139 sq. mm at 1 Mega bit and 94 sq. mm at 2 Mega bit. Therefore, in case of using a 2 Mega bit EPROM semiconductor element for the prior ceramic package structure, there are such disadvantages that sealing strength between a ceramic lid and a package is weak and an airtight state cannot be maintained.

SUMMARY OF THE INVENTION

The present invention is made for solving the above disadvantages, and the first embodiment of the invention relates to a ceramic lid for sealing a semiconductor element.

The present invention relates to a ceramic lid for sealing a semiconductor element and having a sealing surface with a ceramic package which is to house a semiconductor element within a recess thereof. The ceramic lid hermetically seals the recess of the package and the semiconductor element with the aid of a glass sealant. The ceramic lid is made of alumina of high purity, and to the sealing surface of the ceramic lid is applied a glass sealing aid. The ceramic lid is pretreated at a higher temperature than the heating temperature for sealing the semiconductor element.

The second invention relates to a method of manufacturing a ceramic lid for sealing a semiconductor element by housing a semiconductor element within a recess of a ceramic package, heating the recess with a glass sealant, and hermetically sealing the semiconductor element. The method comprises manufacturing the ceramic lid with alumina of high purity, applying a glass sealing aid of 5-30 μin thickness onto a sealing surface of the ceramic package, heat-treating at a higher temperature than the sealing temperature of the semiconductor element, thereafter applying a glass sealant on the glass sealing aid layer and drying it, and then calcining at a lower temperature than the hermetically sealing temperature of the semiconductor element so as to remove an organic binder contained in the glass sealant.

BRIEF DESCRIPTION OF THE DRAWINGS

For a better understanding of the invention, reference is made to the accompanying drawings, in which:

FIG. 1 is a plan view showing an embodiment of a ceramic lid for a semiconductor memory according to the invention;

FIG. 2 is side view of the ceramic lid shown in FIG. 1;

FIG. 3 is a cross-sectional view showing the condition of sealing the lid according to the invention to a ceramic package;

Figure 4:
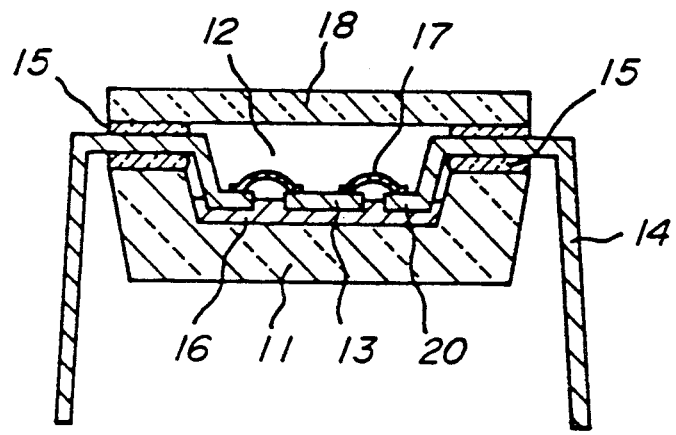
FIGS. 4 and 5 are cross-sectional views of a prior ceramic package.

| | |
|---|---|
| 1 | translucent ceramic lid |
| 1A | ultraviolet translucent window of translucent lid |
| 1B | lid frame |
| 2 | glass sealing aid |
| 3 | glass sealant |
| 4 | sealing glass |
| 5 | lead frame |
| 6 | ceramic package |
| 6A | projected portion of package |
| 7 | semiconductor element |
| 8 | recess of package |
| 9 | wire |
| 11 | ceramic package |
| 12 | recess of package |
| 13 | semiconductor element |
| 14 | lead frame |
| 15 | glass layer |
| 16 | bottom of package |
| 17 | wire |
| 18 | lid |
| 19 | conductor |
| 20 | wire bonding portion |
| 21 | ceramic frame |

DESCRIPTION OF THE PREFERRED EMBODIMENTS

The ceramic package for a semiconductor memory and the method of manufacturing the same according to the invention will be explained in detail by referring to FIGS. 1 to 3.

FIG. 1 shows that a glass sealing aid 2 is applied to a sealing surface of an ultraviolet ray permeable ceramic lid 1 for a semiconductor memory with a ceramic package and treated at a higher temperature than the temperature for sealing a semiconductor element.

The ceramic lid 1 is a high-purity translucent polycrystalline alumina through which ultraviolet rays can permeate, and consists of a central ultraviolet ray permeable window portion 1A and a circumferential frame portion 1B. The sealing aid 2 of the first layer is screen-printed, dried and heat treated at the frame portion 1B at the rear of the lid 1. There is not illustrated, but the glass sealing aid 2 may be formed in the whole region of the frame portion 1B. The glass sealing aid may be a low melting point glass sealant which will be explained in the next step, but crystalline glass is preferable from the standpoint of adhesive strength of the lid with the package. As crystalline glass, use may preferably be made of $SiO_2$-$CaO$-$ZnO$ series glass, $MgO$-$B_2O_3$$SiO_2$ series glass and the like having a sintering temperature 100–250° C. higher than the sealing temperature of a semiconductor element. The reason why the temperature is limited is because less than 100° C. of the sealing temperature can hardly obtain sufficient sealing strength or requires more than 30 minutes for sintering so as to give rise to trouble in mass production, and the sintering temperature exceeding 250° C. hardly contributes to sealing strength.

In case of using a low melting point glass sealant as a glass sealing aid, the heat treating temperature may preferably be 100–200° C. higher than the sealing temperature. The temperature of less than 100° C. also gives rise to trouble in sealing strength, and the temperature exceeding 200° C. makes viscosity at the time of sealing glass small so as to spread the sealing aid beyond the sealing portion or does not show predetermined thermal expansion properties and the like by evaporation, diffusion and the like.

As a method of applying a glass sealing aid, in a glass sealing aid is kneaded a vehicle dissolved 5% of low molecular acryl resin in terpineol or a 5–10% of ethylcellulose in butylcarbitolacetate to prepare printing paste, and printed with the screen of 80–100 mesh made of stainless steel. A printing thickness may preferably be 5–30 $\mu$. If the printing thickness is less than 5 $\mu$, depending on the condition of a ceramic lid, such as surface coarseness and the like, a glass sealing aid layer becomes too thin or almost no layer is existent for contributing to improvement of strength, and in order to form a thickness exceeding 30 $\mu$, it is necessary to repeat printing and there is no contribution to improvement of strength.

FIG. 2 shows the formation of a glass sealant 3 of the second layer on the sealing surface of a ceramic package including a glass sealing aid 2 formed on a ceramic lid 1.

The composition of a glass sealant may be commonly used glass for sealing IC package, and mention may be made of $PbO_2$-$B_2O_3$-$SiO_2$ series low melting point glass, or low melting point glass added with components such as $Al_2O_3$, $TiO_2$, $SnO$, $Na_2O$, $K_2O$ and the like to this borosilicate glass series and the like.

For selecting a glass sealant, it is necessary to give consideration to a sealant temperature and time, for reducing thermal damage on the semiconductor element as much as possible, so that use is made of low melting point glass usually having a sealing temperature of about 410°C.–600°C. and a time of about 10 minutes. Moreover, the ceramic package and the ceramic lid are made of alumina, so that in order to minimize a sealing strain, a coefficient of thermal expansion of the glass sealant is selected as about $50-70 \times 10^{-7}/°$ C. within the range of 30–250°C.

The composition of a representative glass sealant contains 60–85% by weight of PbO, 7–10% by weight of $B_2O_3$, 10–30% by weight of $SiO_2$, and 3–10% by weight of one or more than two of $Al_2O_3$, $TiO_2$ and $SnO_2$.

The above glass sealant is kneaded with the same vehicle as that in the method of applying said glass sealing aid to prepare printing paste, printed on the sealing surface of a ceramic package including the glass sealing aid 2 of the ceramic lid 1 according to a screen printing method and thereafter dried. Printing and drying are usually repeated 3–4 times to obtain a predetermined thickness of 200–300 $\mu$. Drying is carried out for about 10–20 minutes at 120° C.

After printing and drying, in order to remove an organic binder (low molecular acrylic resin liquid and the like) of the vehicle contained in the glass paste for sealing, there is carried out calcination for thermal decomposition by slowing a temperature rising rate within the temperature range of 320–380° C. lower than the airtight sealing temperature of a semiconductor element in air or nitrogen.

The thus formed ceramic lid 1 is sealed on a projected portion 6A of an IC package 6 through glass sealing layers 4 previously formed in the same manner as the ceramic lid after a semiconductor element 7 is mounted on the bottom portion of a recess 8 of a package 6 as shown in FIG. 3. Wires 9 are bonded between the semiconductor element 7 and a lead frame 5 formed in the projected portion 6A of the package 6. The sealing condition is the same explained with respect to the sealing glass.

Figure 5:
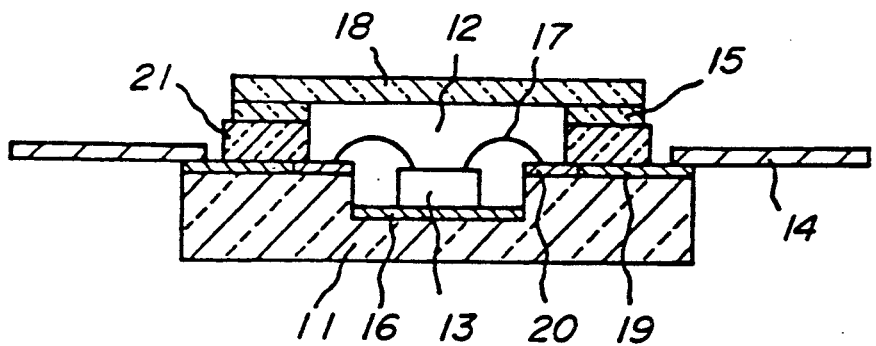

In addition, the lid according to the invention may be sealed in the portion where the lead frame is formed as shown in FIG. 3, or sealed in a ceramic frame provided on elongated conductor portions 19 of wire bonding portions 20 as shown in FIG. 5. Moreover, the lid can be applied to the case of having no metal lead frame, that is, the so-called leadless package, as not shown in FIGS. 3 and 4.

EXAMPLE

There were prepared ceramic lids of permeable high purity alumina consisting of 99.9% of $Al_2O_3$ and 0.05% of MgO and black alumina consisting of 90% of $Al_2O_3$, 2.9% of Mn, 2.3% of $TiO_2$ and 2.3% of $Fe_2O_3$. The dimensional shape of the lids was 20×11×0.65 (thickness).

There was also prepared a ceramic package made of the same black alumina as that of the ceramic lid and having an external shape of 20×11×0.05 (thickness). Sealing portion with the lid was 20×11 and the package had a window of 1.3×8 at the center.

The sealing surfaces of the high purity alumina lid and the black alumina lid 1 with the ceramic package were printed and heat-treated with the use of crystalline glass and low melting point non-crystalline sealing glass as glass sealing aid layers under the condition shown in Table 1. Then, on the glass sealing aid layer was further printed a low-melting point non-crystaline sealing glass to a thickness of 200 $\mu$, which was heat-treated at 380° C. for 10 minutes, to form a glass sealing layer, and thus prepare a ceramic lid for sealing. On the other hand, on the portion corresponding to the sealing surface of the ceramic lid with the black alumina package was formed a glass sealing layer under the same condition as that of the lid.

Figure 7:
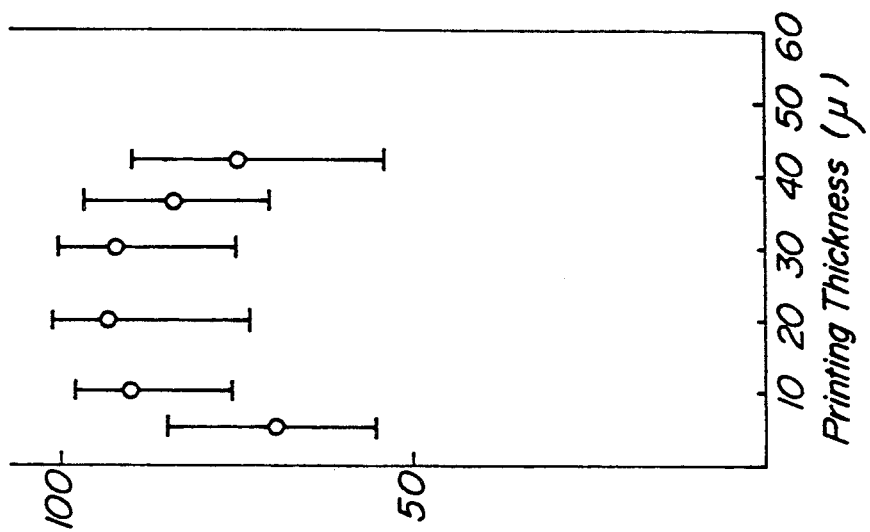
Figure 6:
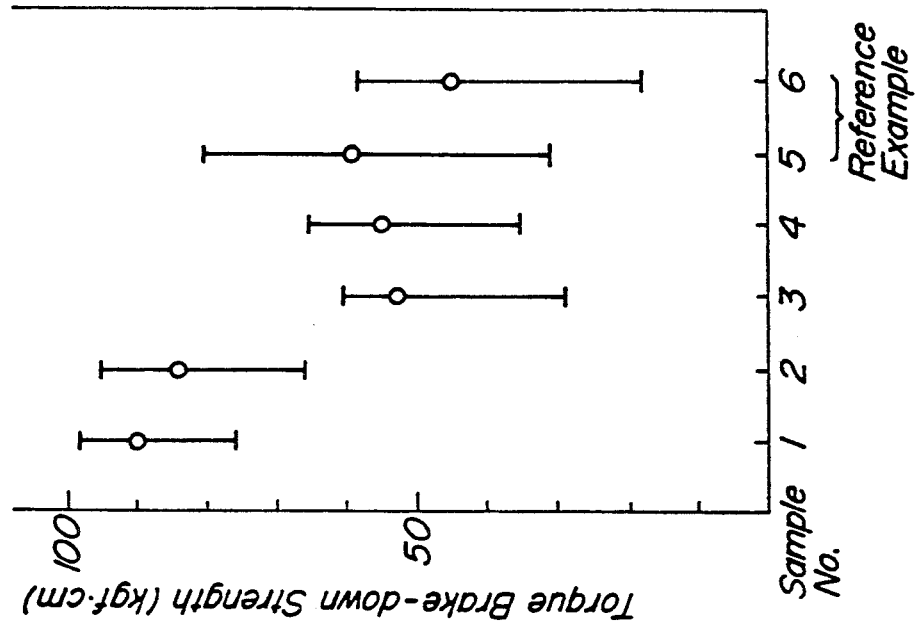
FIG. 6 is a graph showing shearing torque values of the present example and the reference example.

The thus obtained lid and the package were heat-treated at temperatures shown in Table 1 for 10 minutes, and the lid and the package were sealed. Then, the thus obtained sealed body was measured at the shearing torque of the sealed surface by lid torque for glass-frit-sealed packages of American Military Standard MIL-STD-883 C 2024.2. The average value of ten test pieces as a result of measurement is shown in Table 1, and the maximum, average and minimum values are shown in a graph of FIG. 6. The ceramic lids formed with glass sealing aid layers according to the invention show high shearing torque values. An example of Table 2 is to examine an influence of a printing thickness of a glass sealing aid layer formed on the ceramic lid, and the other conditions are the same as in Table 1. With respect to shearing torque values, No. 1 of Table 1 and Nos. 1-5 of Table 2 are shown in a graph of FIG. 7. It is understood from this graph that a preferable printing thickness of the glass sealing assistant layer is 5-30 $\mu$.

Figure 8:
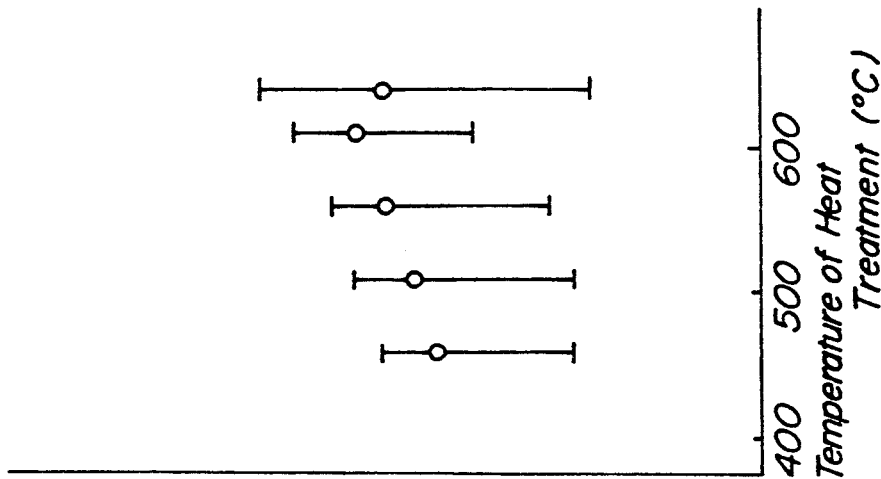
FIGS. 7 and 8 are graphs showing shearing torque values of the present example.

An example of Table 3 is to examine an influence of a heat treating temperature of the glass sealing aid layer formed on the ceramic lid, and the shearing torque values are shown in a graph of FIG. 8 together with No 3 data of Table 1. From this graph, in case of low melting point non-crystalline glass, it is preferable to apply heat treatment at a 100-200° C. higher temperature than the sealing temperature.

TABLE 1

| | Ceramic lid | | | | | | | | |
|---|---|---|---|---|---|---|---|---|---|
| | | Glass sealing aid layer | | | Glass sealing layer | | | | Torque |
| No. | Quality | Quality | Print thickness ($\mu$) | Heat treatment temperature (°C.) | Quality | Heat treatment temperature (°C.) | Ceramic package Quality | Lid/package sealing temperature (°C.) | strength Mean value (Kgf-cm) | Remarks |
|---|---|---|---|---|---|---|---|---|---|---|
| 1 | HA | CG-1 | 10 | 850 | SG-1 | 380 | BA | 410 | 90 | Present |
| 2 | HA | CG-2 | 10 | 850 | SG-1 | 380 | BA | 410 | 85 | invention |
| 3 | HA | SG-1 | 10 | 560 | SG-1 | 380 | BA | 410 | 52 | |
| 4 | HA | SG-2 | 10 | 540 | SG-2 | 380 | BA | 420 | 55 | |
| 5 | BA | — | — | — | SG-1 | 380 | BA | 410 | 59 | Comparative Example |
| 6 | HA | — | — | — | SG-1 | 380 | BA | 410 | 45 | |

Note
HA: High-pure alumina.
HB: Black alumina.
CG-1: $MgO-B_2O_3-SiO_2$ series crystalline glass ... (Iwaki Glass No. GA-30)
CG-2: $SiO-CaO-ZnO$ series crystalline glass ... (Asahi Glass No. AP 5576)
SG-1: $PbO-B_2O_3-SiO_2$ series crystalline glass ... (Iwaki Glass No. LS 3001)
SG-2: $PbO-B_2O_3-SiO_2$ series crystalline glass ... (Iwaki Glass No. CT-410)

TABLE 2

| | Ceramic lid | | | | | | | | Torque |
|---|---|---|---|---|---|---|---|---|---|
| | | Glass sealing aid layer | | | Glass sealing layer | | | | |
| No. | Quality | Quality | Print thickness ($\mu$) | Heat treatment temperature (°C.) | Quality | Heat treatment temperature (°C.) | Ceramic package Quality | Lid/package sealing temperature (°C.) | strength Mean value (Kgf-cm) |
| 1 | HA | CG-1 | 5 | 850 | SG-1 | 380 | BA | 410 | 70 |
| 2 | HA | CG-1 | 10 | 850 | SG-1 | 380 | BA | 410 | 93 |
| 3 | HA | CG-1 | 30 | 850 | SG-1 | 380 | BA | 410 | 92 |
| 4 | HA | CG-1 | 36 | 850 | SG-1 | 380 | BA | 410 | 85 |
| 5 | HA | CG-1 | 42 | 850 | SG-1 | 380 | BA | 410 | 75 |

TABLE 3

| | Ceramic lid | | | | | | |
| | Glass sealing aid layer | | | Glass sealing layer | | | Torque strength |
| No | Quality | Quality | Print thickness (μ) | Heat treatment temperature (°C.) | Quality | Heat treatment temperature (°C.) | Ceramic package Quality | Lid/package sealing treatment (°C.) | Mean value (Kgf-cm) |
|---|---|---|---|---|---|---|---|---|---|
| 1 | HA | SG-1 | 10 | 460 | SG-1 | 380 | BA | 410 | 45 |
| 2 | HA | SG-1 | 10 | 510 | SG-1 | 380 | BA | 410 | 49 |
| 3 | HA | SG-1 | 10 | 610 | SG-1 | 380 | BA | 410 | 57 |
| 4 | HA | SG-1 | 10 | 640 | SG-1 | 380 | BA | 410 | 53 |

As apparent from the above examples, according to the invention, sealing strength of the package lid of the ceramic package is improved. The reason is because the glass sealing aid layer is previously heat treated at higher temperature than the sealing temperature, so that the glass sealing aid layer is diffused on the high purity alumina lid surface to improve affinity and to improve wettability with the glass sealing layer.

As above, the ceramic lid according to the invention is explained by referring to examples of the translucent alumina lid for EPROM semiconductor element, but the ceramic lid is not limited to translucent alumina from the essential feature of the invention, and the invention is effective for high purity alumina, such as more than 96% of an alumina lid.

As apparent from the above explanation, the ceramic lid and the method of manufacturing the same according to the invention are industrially useful with excellent sealing strength, particularly in case of ceramic lid for ultraviolet ray erasing type semiconductor memory, with a remarkable effect by offering a lid simply meeting with the increase of memory amount of semiconductor element.

What is claimed is:

1. A method of manufacturing a ceramic lid for sealing a semiconductor element by housing a semiconductor element within a recess of a ceramic package, heating said ceramic lid with a glass sealant, and hermetically sealing said semiconductor element within said ceramic package, said method comprising the steps of manufacturing said ceramic lid with alumina of high purity having a sealing surface with said recess of a ceramic package; applying to the sealing surface of said ceramic lid a glass sealing aid layer of 5-30 μ in thickness; heat treating said ceramic lid with said glass sealing aid applied thereto at a higher temperature than the hermetic sealing temperature of the semiconductor element; applying and drying a glass sealant on said glass sealing aid layer; and calcining said ceramic lid with said glass sealing aid layer and said glass sealant applied thereto at a lower temperature than the hermetic sealing temperature of the semiconductor element, thereby removing an organic binder contained in the glass sealant.

2. A ceramic lid for sealing a semiconductor element within a recess of a semiconductor package, comprising:
   a cermic lid substrate consisting essentially of high purity alumina, said substrate having a sealing surface region provided on a surface thereof which is to be hermetically sealed to a sealing surface of the semiconductor package via a glass sealant material; and
   a glass sealing aid fixed to said sealing surface portion of said ceramic lid substrate;
   wherein said ceramic lid substrate, with said glass sealing aid fixed thereto, is heat treated at a temperature higher than a temperature at which said ceramic lid is hermetically sealed to said semiconductor package via said glass sealant material.

3. The ceramic lid of claim 2, wherein said ceramic lid consists essentially of translucent alumina.

4. The ceramic lid of claim 2, wherein said glass sealing aid consists of crystalline glass.

5. The ceramic lid of claim 4, wherein said crystalline glass is selected from the group consisting of $SiO_2$-CaO-ZnO series glass and $MgO$-$B_2O_3$-$SiO_2$ series glass, and has a sintering temperature of 100-250° C. higher than the hermetic sealing temperature of the semiconductor package.

6. A ceramic semiconductor package, comprising:
   a ceramic base member having a recess formed therein for housing a semiconductor element and a sealing surface portion surrounding said recess;
   a ceramic lid substrate consisting essentially of high purity alumina, said substrate having a sealing surface region provided on a surface thereof which is to be hermetically sealed to said sealing surface portion of said ceramic base member;
   a glass sealing aid fixed to said sealing surface region of said ceramic lid substrate, wherein said ceramic lid substrate, with said glass sealing aid fixed thereto, is heat treated at a temperature higher than a temperature at which said ceramic lid substrate is hermetically sealed to said ceramic base member, before said ceramic lid substrate is hermetically sealed to said ceramic base member; and
   a glass sealant layer provided between said ceramic lid substrate and said ceramic base member so as to hermetically seal said ceramic lid substrate to said ceramic base member.

7. The ceramic semiconductor package of claim 6, wherein said ceramic lid substrate consists essentially of translucent alumina.

8. The ceramic semiconductor package of claim 6, wherein said glass sealing aid consists of crystalline glass.

9. The ceramic semiconductor package of claim 8, wherein said crystalline glass is selected from the group consisting of $SiO_2$-CaO-ZnO series glass and $MgO$-$B_2O_3$-$SiO_2$ series glass, and has a sintering temperature of 100-250° C. higher than the hermetic sealing temperature of the semiconductor package.

* * * * *